(12) United States Patent
Ogawa et al.

(10) Patent No.: US 7,446,262 B2
(45) Date of Patent: Nov. 4, 2008

(54) LAMINATED ELECTRONIC COMPONENT AND METHOD FOR PRODUCING THE SAME

(75) Inventors: Nobuaki Ogawa, Omihachiman (JP); Norio Sakai, Moriyama (JP); Yoshihiko Nishizawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 257 days.

(21) Appl. No.: 10/549,005

(22) PCT Filed: Jan. 6, 2005

(86) PCT No.: PCT/US2005/000051

§ 371 (c)(1), (2), (4) Date: Sep. 14, 2005

(87) PCT Pub. No.: WO2005/071745

PCT Pub. Date: Aug. 4, 2005

(65) Prior Publication Data

US 2007/0026196 A1  Feb. 1, 2007

(30) Foreign Application Priority Data

Jan. 27, 2004  (JP) .......................... 2004-018285

(51) Int. Cl.
*H05K 1/03* (2006.01)
(52) U.S. Cl. .................. 174/255; 174/260; 174/261
(58) Field of Classification Search .......... 174/260, 174/262, 255; 361/792, 793, 794, 795
See application file for complete search history.

(56) References Cited

U.S. PATENT DOCUMENTS 5,943,212 A * 8/1999 Horiuchi et al. ............. 361/704
6,259,157 B1 * 7/2001 Sakamoto et al. ........... 257/723
6,815,810 B2 * 11/2004 Takehara et al. ............ 257/687
6,818,979 B2   11/2004 Takehara et al.
6,938,332 B2    9/2005 Harada et al.
7,042,087 B2 *  5/2006 Sakamoto et al. ........... 257/734

(Continued)

FOREIGN PATENT DOCUMENTS

CN       1395464 A    2/2003

(Continued)

OTHER PUBLICATIONS

Official communication issued in the counterpart Chinese Application No. 2005800000975, mailed on Jun. 22, 2007.

*Primary Examiner*—Ishwar (I. B.) Patel
(74) *Attorney, Agent, or Firm*—Keating & Bennett, LLP

(57) ABSTRACT

A laminated electronic component includes a ceramic substrate having a first groove provided on a principal surface thereof and extending to the side surfaces, and a resin sheet. The resin sheet includes a thermosetting resin in a semi-cured state and is compression bonded on the principal surface of the ceramic substrate so as to cover the first groove. The resin sheet is then cured by heating. Thus, a combined laminate is produced. When the resin sheet is compression bonded, air trapped in the interface with the ceramic substrate is discharged outside through the first groove. The combined laminate is divided into separate pieces along the first groove. An outer terminal electrode is formed on the outer surface of a resin layer of the resultant separate piece.

15 Claims, 5 Drawing Sheets

U.S. PATENT DOCUMENTS

2003/0071350 A1 4/2003 Takehara et al.
2003/0141105 A1 7/2003 Sugaya et al.
2005/0040522 A1 2/2005 Hideki et al.

FOREIGN PATENT DOCUMENTS

| | | |
|---|---|---|
| CN | 1412838 A | 4/2003 |
| JP | 53-84681 | 7/1978 |
| JP | 10-264130 | 10/1998 |
| JP | 11-265964 | 9/1999 |
| JP | 2001-244638 | 9/2001 |
| JP | 2002-110716 | 4/2002 |
| JP | 2003-007367 | 1/2003 |
| JP | 2003-124435 | 4/2003 |

* cited by examiner

FIG.1
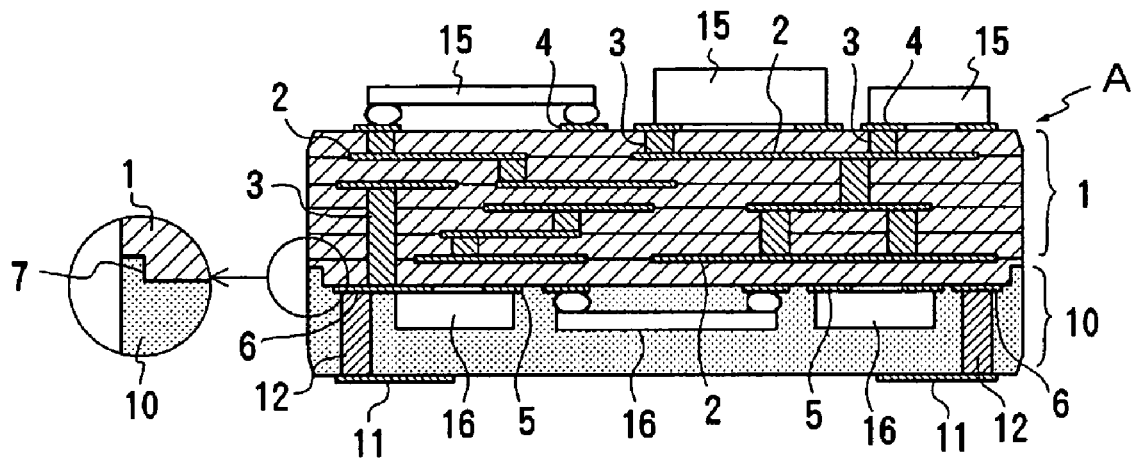
FIG.2A  FIG.2B  FIG.2C
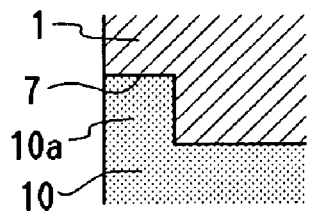 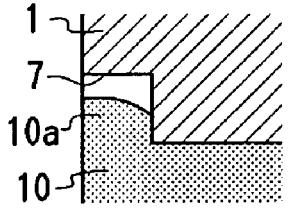 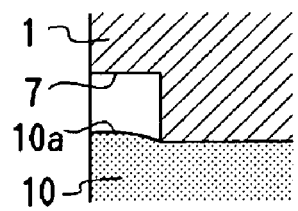
FIG.3
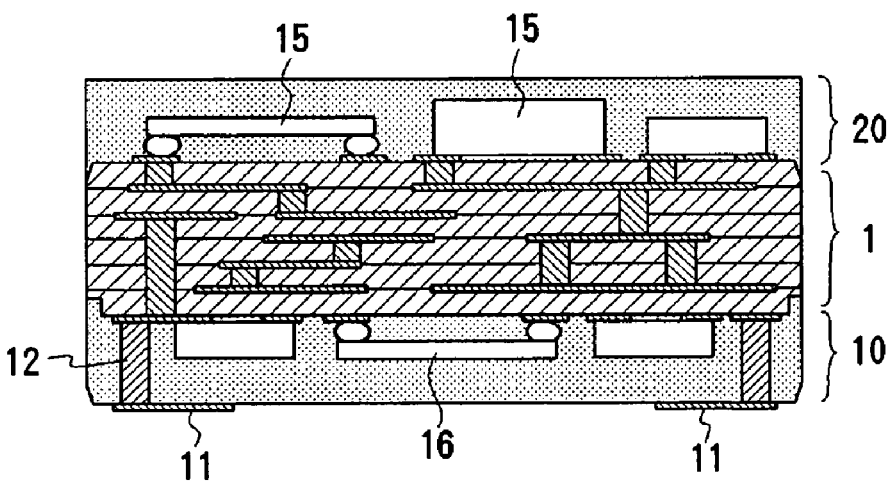

LAMINATED ELECTRONIC COMPONENT AND METHOD FOR PRODUCING THE SAME

BACKGROUND OF THE INVENTION

1. Field of the Invention

The present invention relates to a laminated electronic component formed by compression bonding and laminating a ceramic substrate and a resin sheet, and a method for producing the same.

2. Description of the Related Art

To achieve miniaturization and high function of radio communication devices such as cellular phones, components installed therein must provide high function in smaller spaces. In order to meet this demand, a laminated electronic component including a ceramic multilayer substrate has been used.

Recently, low temperature co-fired ceramic (LTCC) multilayer substrates have been primarily used as such ceramic multilayer substrates. This is because the LTCC can be fired at a low temperature of up to about 1,000° C., and a low resistance metal, such as silver or copper, can be used as a wiring conductor.

However, since the LTCC often includes a considerable amount of glass in order to decrease the firing temperature, the LTCC is more fragile than pure ceramics. For example, pure alumina has a flexural strength of about 300 MPa, whereas a glass ceramic including alumina and glass with a 50:50 by volume ratio has a flexural strength of about 200 MPa.

Therefore, when a drop test is performed with such a ceramic multilayer substrate mounted on a printed wiring board, a tensile stress is generated at a bonded portion between the ceramic multilayer substrate and the printed wiring board. As a result, cracks are easily produced on the mounting surface of the ceramic multilayer substrate.

Japanese Unexamined Patent Application Publication No. 2003-7367 (Patent Document 1) proposes a combined ceramic component in which a resin layer for shock absorption is provided on the mounting surface of a ceramic multilayer substrate.

When such a combined ceramic component is mass-produced, a method in which a master substrate of a ceramic multilayer substrate is divided to form sub-substrates is generally used. Examples of the method for dividing include dividing by cutting with a dicer and dividing by breaking along a dividing groove.

In order to mass-produce the ceramic multilayer substrate described in Patent Document 1, first, a resin sheet must be bonded on a master substrate of the ceramic multilayer substrate, the resin sheet having approximately the same area as that of the master substrate. A resin sheet including a thermosetting resin, such as an epoxy resin, and an additional inorganic filler composed of, for example, $SiO_2$, is primarily used.

According to a method for bonding the resin sheet, as described in Patent Document 1, a resin sheet including a thermosetting resin in a semi-cured state (in a B-stage state or a prepreg state) is compression bonded on the ceramic multilayer substrate by heating.

However, when a resin sheet having the same area as that of the master substrate is compression bonded, air is often trapped in the interface between the ceramic multilayer substrate and the resin sheet because of the large area. This air is expanded by heat during, for example, the reflow of solder, which causes a problem that the ceramic multilayer substrate is separated from the resin layer.

In addition, when the air is trapped in a conducting portion between the ceramic multilayer substrate and the resin sheet (for example, an interface between an electrode of the ceramic multilayer substrate and a via hole conductor of the resin sheet), conduction failure may be caused.

SUMMARY OF THE INVENTION

To overcome the problems described above, preferred embodiments of the present invention provide a laminated electronic component in which air trapping in the interface between a ceramic substrate and a resin layer is minimized so as to prevent separation of the ceramic substrate from the resin layer, and a method for producing such a novel laminated electronic component.

A preferred embodiment of the present invention provides a laminated electronic component including a combined laminate including a ceramic substrate having a first principal surface, a second principal surface, side surfaces, and a recess extending continuously on the peripheral portion of the principal surface, and a resin layer that is compression bonded and cured by heating on the first principal surface of the ceramic substrate, wherein a portion of the peripheral portion of the resin layer is embedded in the recess, and an outer terminal electrode is provided on the outer surface of the resin layer.

Another preferred embodiment of the present invention provides a laminated electronic component including a combined laminate including a ceramic substrate having a first principal surface, a second principal surface, side surfaces, and a plurality of groove portions provided on the side surfaces and extending in the thickness direction, and a resin layer that is compression bonded and cured by heating on the first principal surface of the ceramic substrate, wherein a portion of the peripheral portion of the resin layer is embedded in the groove portions, and an outer terminal electrode is provided on the outer surface of the resin layer.

Another preferred embodiment of the present invention provides a method for producing a laminated electronic component including a first step of preparing a ceramic substrate having a first principal surface, a second principal surface, side surfaces, and a first groove provided on the first principal surface and extending to the side surfaces, and a resin sheet having a first principal surface and a second principal surface and including a thermosetting resin in a semi-cured state, a second step of producing a combined laminate by placing the first principal surface of the ceramic substrate on the first principal surface of the resin sheet, by compression bonding the resin sheet on the first principal surface of the ceramic substrate so as to cover the first groove, and by curing the resin sheet with heat, and a third step of dividing the combined laminate into separate pieces along the first groove.

Another preferred embodiment of the present invention provides a method for producing a laminated electronic component including a first step of preparing a ceramic substrate having a first principal surface, a second principal surface, and a plurality of through holes extending from the first principal surface to the second principal surface, the through holes being arranged in a desired array, and a resin sheet having a first principal surface and a second principal surface and including a thermosetting resin in a semi-cured state, a second step of producing a combined laminate by placing the first principal surface of the ceramic substrate on the first principal surface of the resin sheet, by compression bonding the resin sheet on the first principal surface of the ceramic substrate so as to cover the through holes, and by curing the resin sheet with heat, and a third step of dividing the combined laminate into separate pieces along the through holes.

According to various preferred embodiments of the present invention, a ceramic substrate and a resin sheet including a thermosetting resin in a semi-cured state are compression bonded, and cured by heating. In this step, since the ceramic substrate and the resin sheet that are in a master substrate state are compression bonded in a large area, air is easily trapped in the interface, causing air trapping. However, a first groove extending to the side surfaces is provided on a principal surface of the ceramic substrate facing the resin sheet. Therefore, even when air is trapped in the interface, the air is discharged at the side surfaces via the first groove. Accordingly, air trapping is prevented. Consequently, even when heat caused by, for example, reflow soldering is applied, the separation of the ceramic substrate from the resin layer is prevented. In addition, since the air trapping is prevented, conduction failure in a conducting portion between the ceramic substrate and the resin layer is prevented.

Furthermore, in preferred embodiments of the present invention, a combined laminate including the ceramic substrate and the resin sheet is divided into separate pieces along the first groove, which is a groove for discharging air. In other words, the first groove serves as a dividing groove in addition to a groove for discharging air. The first groove is separated by dividing the combined laminate to form a recess that continuously extends around the peripheral portion. When the resin sheet is compression bonded to the ceramic substrate, a portion of the resin sheet is inserted in the first groove. Accordingly, when the combined laminate is divided along the first groove, the peripheral portion of the resin layer is embedded in the recess provided on the peripheral portion of the ceramic substrate. In other words, a portion of the resin layer embedded in the recess provides an anchoring function to prevent the separation of the resin layer from the ceramic substrate. Regarding the insertion of the resin layer in the recess, the resin layer is not required to completely fill the recess and only a portion of the resin layer may be inserted.

The cross-sectional shape of the recess corresponds to the cross-sectional shape of the first groove. For example, when the cross-sectional shape of the first groove is a quadrangle, the cross-sectional shape of the recess is a stair shape. When the cross-sectional shape of the first groove is a semicircle, the cross-sectional shape of the recess is a quarter circle. When the cross-sectional shape of the first groove is a V-shape, the cross-sectional shape of the recess is a tapered shape.

When a drop test is performed with a laminated electronic component according to one of the preferred embodiments of the present invention mounted on a printed wiring board, a tensile stress is generated at a bonded portion between the ceramic substrate and the printed wiring board. As a result, cracks are often generated on the mounting surface of the ceramic substrate. However, since a resin layer for shock absorption is provided on the mounting surface of the ceramic substrate, a stress applied on the ceramic substrate is greatly reduced. Therefore, even when the ceramic substrate is composed of an LTCC, the generation of cracks is effectively prevented.

Alternatively, a plurality of through holes may be used instead of the first groove. When a ceramic substrate and a resin sheet in a semi-cured state are compression bonded in an opposed manner, air is easily trapped in the interface between the ceramic substrate and the resin sheet. However, a plurality of through holes is provided on the principal surface of the ceramic substrate, which faces the resin sheet. Therefore, even when air is trapped in the interface, the air is discharged to the other principal surface of the ceramic substrate through the through holes. Accordingly, air trapping is prevented. Consequently, even when heat, which is caused by, for example, reflow soldering is applied, the separation of the ceramic substrate from the resin layer is effectively prevented.

When the resin sheet is compression bonded to the ceramic substrate, a portion of the resin sheet is inserted in the through holes. Accordingly, when the combined laminate is divided along the through holes, the through holes provide a plurality of groove portions extending on the side surfaces of the peripheral portion of the ceramic substrate in the thickness direction. Since the peripheral portion of the resin layer is embedded in the groove portions so as to provide an anchoring function, the separation of the resin layer from the ceramic substrate is effectively prevented.

The resin sheet in a semi-cured state is compression bonded to the ceramic substrate by heating, and thus, the resin sheet is cured by heating. The compression bonding and the curing by heating need not be performed at the same time. The term "semi-cured state" refers to an intermediate state in the curing reaction and represents a B-stage state or a prepreg state. An inorganic filler is added to the thermosetting resin as required in order to adjust the thermal expansion coefficient of the resin layer or the fluidity of the resin layer.

The thickness of the resin layer can be reduced to as small as about 50 μm. However, when a circuit device is installed, a thickness greater than or equal to the height of the device is required. For example, when a circuit device having a height of about 200 μm is installed, the thickness of the resin layer is preferably at least about 300 μm. When no device is installed, the thickness of the resin layer is preferably at least about 100 μm. When a device is installed, the thickness of the resin layer is preferably the height of the device plus at least about 100 μm.

The combined laminate may be divided by breaking or by cutting with a dicer as described. When the cutting is performed with a dicer having a width that is greater than or equal to the width of the first groove, no portion of the groove remains on the side surfaces of the separated pieces after cutting.

The cross-sectional shape of the first groove may be any suitable shape, such as a trapezoid, a quadrangle, a triangle, or a semicircle. In addition, when the combined laminate is divided by breaking, the cross-sectional shape of the first groove may have a shape, such as a triangle, so that the combined laminate can be easily broken.

The cross-sectional shape of the through holes may be any suitable shape such as a quadrangle, a circle, or an oval.

When a master substrate of the combined laminate is cut with a dicer, a dicer for a wet process may be used to prevent, for example, melting of a resin due to frictional heat. In such a case, moisture may penetrate the master substrate from an exposed bonding edge between the ceramic substrate and the resin layer. Consequently, the moisture expands when subjected to heat caused by, for example, reflow soldering, thereby separating the ceramic substrate from the resin layer. However, a portion of the resin is embedded in the first groove or in the through holes of the ceramic substrate. Thus, the penetration of moisture is prevented. Accordingly, the reliability is greatly improved.

Furthermore, when the cutting by breaking or dicing approaches the interface between the ceramic substrate and the resin sheet, a displacement or chipping is often caused because the cutting is not performed along a straight line because of the differences in the densities of the ceramic substrate and the resin sheet. This causes an exposure of inner electrodes, variations in the dimensions, mounting failure, or other problems. These problems can be eliminated by embedding a portion of the resin in the first groove or in the through holes of the ceramic substrate.

The ceramic substrate according to preferred embodiments of the present invention is preferably a ceramic multilayer substrate. Alternatively, a single layer ceramic substrate may be used. The ceramic multilayer substrate may include a multilayer capacitor or a multilayer inductor therein.

The laminated electronic component according to preferred embodiments of the present invention preferably further includes a first internal circuit element provided inside of the ceramic substrate, and a second internal circuit element provided inside of the resin layer and electrically connected to the first internal circuit element, wherein the outer terminal electrode is electrically connected to the second internal circuit element.

The first internal circuit element is a generic name including an inner electrode disposed inside the ceramic substrate defined by a layer and a via hole conductor extending through the ceramic substrate in the thickness direction. The second internal circuit element is a generic name including an inner conductor extending in the plane direction of the resin layer and a via hole conductor extending through the resin layer in the thickness direction. The inner conductor includes a ground electrode.

In addition, the laminated electronic component preferably further includes a first pad electrode provided on the second principal surface of the ceramic substrate and electrically connected to the first internal circuit element, and a first circuit device mounted on the first pad electrode. Thus, the function of the laminated electronic component is further improved. Examples of the circuit device include active devices such as an IC and an LSI, and passive devices such as a chip capacitor, a chip resistor, a chip thermistor, and a chip inductor. After the circuit device is installed, the device may be bonded with an Au, Al, or Cu wire.

A mold resin layer is preferably provided on the second principal surface of the ceramic substrate so as to embed the first circuit device. Since the mold resin layer protects the circuit device, a structure having excellent moisture resistance and improved reliability is provided. Furthermore, since the surface of the mold resin layer can be picked up with a mounter using suction, the surface mounting can be easily performed.

A case is preferably provided on the second principal surface of the ceramic substrate so as to cover the first circuit device. Since the circuit device is covered with the case, a structure having excellent moisture resistance and improved reliability is provided. In addition, since the surface of the case can be picked up with a mounter using suction, the surface mounting can be easily performed.

A portion of the case is preferably embedded in the groove portions disposed at the peripheral portion of the second principal surface of the ceramic substrate. Thus, displacement between the case and the ceramic substrate is prevented.

The laminated electronic component according to preferred embodiments of the present invention preferably further includes a second pad electrode provided at the interface between the ceramic substrate and the resin layer and electrically connected to the first internal circuit element or the second internal circuit element, and a second circuit device mounted on the second pad electrode and fixed so as to be embedded in the resin layer. The resin layer functions as a shock absorber and as a protective layer for the second circuit device.

In a method for producing a laminated electronic component according to preferred embodiments of the present invention, when the resin sheet is compression bonded on the first principal surface of the ceramic substrate, the resin sheet may fill the first groove or the through holes completely or partially. Alternatively, the resin sheet may not fill the first groove or the through holes at all. In other words, it is sufficient that the resin sheet is in close contact with the first principal surface of the ceramic substrate. According to preferred embodiments of the present invention, since a portion of a resin layer is embedded in a recess provided on the peripheral portion of a ceramic substrate, a portion of the embedded resin provides an anchoring function to prevent the separation of the ceramic substrate from the resin layer. As a result, a laminated electronic component having greatly improved reliability is produced.

Furthermore, in the laminated electronic component according to preferred embodiments of the present invention, the resin layer for shock absorption is preferably provided on the mounting surface of the ceramic substrate. Therefore, even if a dropping shock or other force is applied to the laminated electronic component, the stress applied to the ceramic substrate is greatly reduced. Even when the ceramic substrate is composed of an LTCC, the generation of cracks is effectively prevented.

According to one of the preferred embodiments of the present invention, the laminated electronic component preferably includes a plurality of groove portions extending in the thickness direction instead of a recess. Since a portion of a resin layer is embedded in the groove portions provided on the peripheral portion of a ceramic substrate, a portion of the embedded resin provides an anchoring function to prevent the separation of the ceramic substrate from the resin layer.

Furthermore, the resin layer for shock absorption is provided on the mounting surface of the ceramic substrate. Therefore, even if a dropping shock or other force is applied, the stress applied to the ceramic substrate is reduced, and thus, the generation of cracks on the ceramic substrate is prevented.

Air in the interface accumulated during the compression bonding of a ceramic substrate with a resin sheet is discharged outside through a first groove. Consequently, air trapping is prevented and air does not remain in the interface between the ceramic substrate and the resin sheet. Therefore, after the combined laminate is divided into separate pieces, even when heat caused by, for example, reflow soldering is applied, the separation of the ceramic substrate from the resin layer is prevented.

Furthermore, the first groove preferably serves as not only a groove for discharging air but also a dividing groove used for dividing the combined laminate into separate pieces. Therefore, the dividing of the combined laminate is more easily performed.

According to a preferred embodiment of the present invention, a plurality of through holes is provided instead of the first groove. Air trapped in the interface between the ceramic substrate and the resin sheet can be discharged outside through the through holes, and thus, air trapping is prevented.

Furthermore, the through holes are arranged on dividing lines used for dividing the combined laminate into separate pieces. Therefore, the through holes serve not only as holes for discharging air but also as dividing holes used for dividing the combined laminate into separate pieces. Thus, the dividing of the combined laminate is more easily performed.

These and other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a cross-sectional view of a laminated electronic component according to a first preferred embodiment of the present invention.

FIGS. 2A-2C are enlarged cross-sectional views of a peripheral portion of a bonded portion between a resin sheet and a ceramic multilayer substrate.

FIG. 3 is a cross-sectional view of a laminated electronic component according to a second preferred embodiment of the present invention.

DETAILED DESCRIPTION OF PREFERRED EMBODIMENTS

Figure 4:
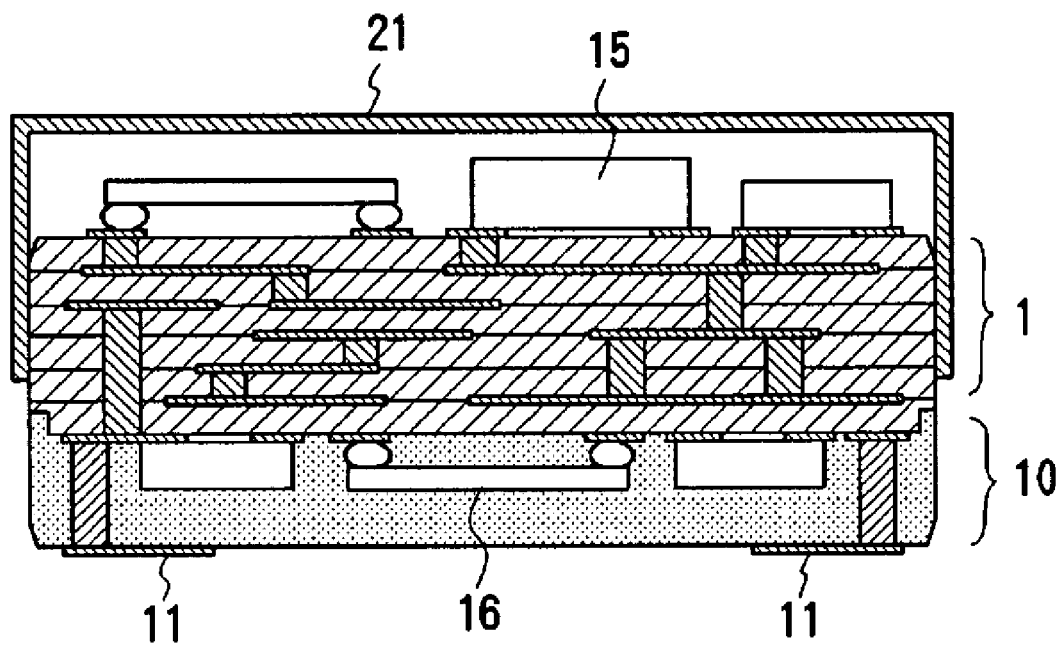
FIG. 4 is a cross-sectional view of a laminated electronic component according to a third preferred embodiment of the present invention.

Preferred embodiments of the present invention will now be described with reference to the drawings.

FIG. 1 shows a first preferred embodiment of a laminated electronic component according to the present invention.

A laminated electronic component A includes a ceramic multilayer substrate 1 including a plurality of ceramic layers and a resin layer 10 for shock absorption that is fixed on the lower surface (a principal surface) of the ceramic multilayer substrate 1.

The ceramic multilayer substrate 1 is preferably composed of, for example, an LTCC. The ceramic multilayer substrate 1 is preferably formed by laminating a plurality of ceramic layers, with inner electrodes 2 therebetween, and includes via conductors 3 extending through the ceramic layers in the thickness direction. These components are integrated by firing. For example, a multilayer capacitor or a multilayer inductor may also be provided as the integrated component. Pad electrodes 4 and 5 for mounting devices are provided on the upper and lower surfaces of the ceramic multilayer substrate 1.

Circuit devices 15 and 16 are mounted on the pad electrodes 4 and 5 of the ceramic multilayer substrate 1, respectively. Examples of the circuit device include active devices, such as an IC and an LSI, and passive devices, such as a chip capacitor, a chip resistor, a chip thermistor, a chip inductor, and a filter. These devices may be mounted by solder or a conductive adhesive. Alternatively, these devices may be connected with bumps or connected by wire bonding.

The resin layer 10 is preferably composed of a thermosetting resin (an epoxy, a phenol, a cyanate resin, or other suitable thermosetting resin) and an inorganic filler ($Al_2O_3$, $SiO_2$, $TiO_2$, or other suitable inorganic filler) mixed therein. The resin layer 10 is fixed and cured so as to wrap the circuit devices 16 mounted on the lower surface of the ceramic multilayer substrate 1. A peripheral portion 10a of the resin layer 10 is embedded in a stair-shaped recess 7 that is provided on a peripheral portion of the lower surface of the ceramic multilayer substrate 1, as shown in FIG. 1. This structure prevents moisture from penetrating into the interface between the ceramic multilayer substrate 1 and the resin layer 10 and the separation at the interface. A plurality of outer terminal electrodes 11 preferably composed of copper foil is provided on the lower surface of the resin layer 10. The outer terminal electrodes 11 are preferably not composed of thick film electrodes but are preferably composed of copper foil. The reason is, since the outer terminal electrodes 11 are disposed on the resin layer 10 side, they cannot be formed by firing conductive paste. In addition, copper foil and resin can be strongly and securely bonded via a method for producing a printed wiring board. These outer terminal electrodes 11 are electrically connected to connecting electrodes 6 provided on the lower surface of the ceramic multilayer substrate 1 through via hole conductors 12 extending through the resin layer 10 in the thickness direction. The connecting electrodes 6 may be separately formed on the lower surface of the ceramic multilayer substrate 1. Alternatively, ends of the via hole conductors 3 exposed on the lower surface of the ceramic multilayer substrate 1 may define the connecting electrodes 6.

In the laminated electronic component according to the present preferred embodiment, the advantage of preventing the separation of the resin layer 10 is achieved in any number of different cases including, as shown in FIG. 2(a), a case in which a portion 10a of the resin layer 10 completely fills the stair-shaped recess 7 provided on the periphery of the ceramic substrate 1; as shown in FIG. 2(b), a case in which a portion 10a of the resin layer 10 partially fills the stair-shaped recess 7; and as shown in FIG. 2(c), a case in which a portion 10a of the resin layer 10 barely fills the stair-shaped recess 7.

When a portion 10a of the resin layer 10 completely fills the recess 7, as shown in FIG. 2(a), or when a portion 10a of the resin layer 10 partially fills the recess 7, the advantage of preventing moisture from penetrating from the interface between the ceramic substrate 1 and the resin layer 10 is provided because a path of moisture leading to the interface is increased. Therefore, a problem of moisture expanding by heat during, for example, reflow soldering and separating the bonded interface is prevented.

As shown in FIG. 2(c), when the resin layer 10 barely fills the recess 7, the advantage of preventing moisture from penetrating from the interface is not provided. However, bonding reliability is improved because, when a force is applied to the resin layer 10 in the peeling direction, the resin portion is bent so as to absorb the force.

FIGS. 3 and 4 show a second preferred embodiment and a third preferred embodiment of laminated electronic components, respectively. In the laminated electronic component shown in FIG. 1, since the circuit devices 15 mounted on the surface (upper surface) of the ceramic multilayer substrate 1 are exposed, the laminated electronic component is disadvantageous in terms of moisture resistance and is difficult to pick up with a mounter using suction. Accordingly, in FIG. 3, the surface of the ceramic multilayer substrate 1 is molded with a resin 20. In FIG. 4, the surface of the ceramic multilayer substrate 1 is covered with a case 21 covering circuit devices 15. A resin case or a metal case can be used as the case 21. In terms of the ease of processing and cost, nickel silver or phosphor bronze is preferably used for the metal case 21.

Where the surface of the ceramic multilayer substrate 1 is molded with the resin 20, when the thermal expansion coefficient is different between the resin layer 10 and the resin layer 20, which defines the lower and upper surfaces of the ceramic multilayer substrate 1, respectively, the substrate 1 may warp or break due to the thermal hysteresis. Therefore, the resin 10 and the resin 20 preferably have the same composition or both of the resins 10 and 20 are preferably composed of materials having a similar thermal expansion coefficient.

Figure 5:
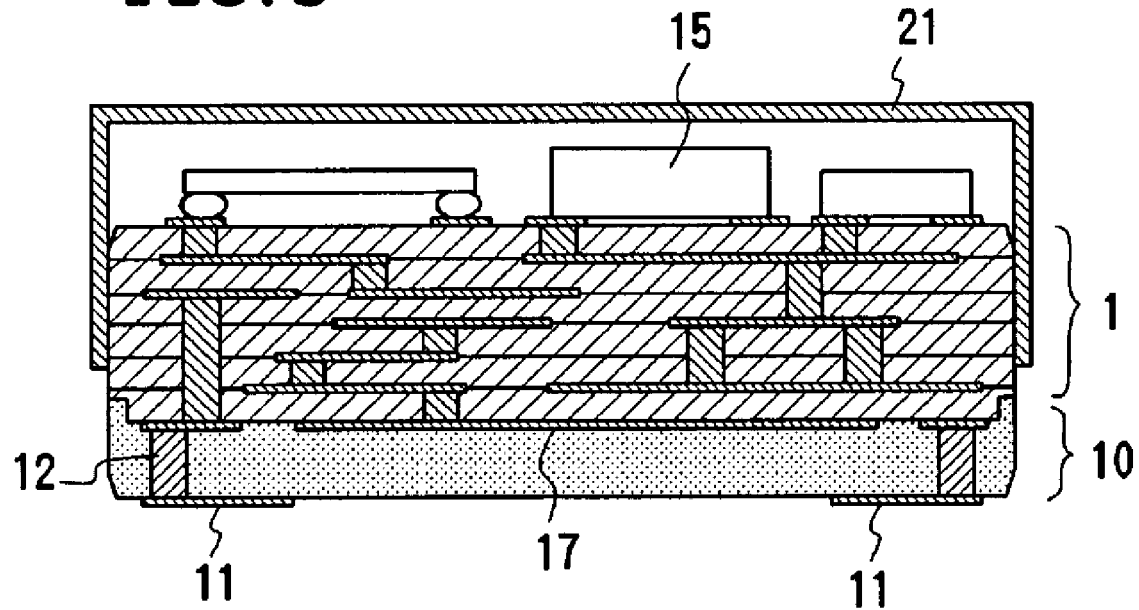
FIG. 5 is a cross-sectional view of a laminated electronic component according to a fourth preferred embodiment of the present invention.

FIG. 5 shows a fourth preferred embodiment in which a ground electrode 17 is provided at the interface between the ceramic multilayer substrate 1 and the resin layer 10.

In a high frequency component, the component and a ground electrode of a printed wiring board on which the component is mounted must be disposed as close as possible in order to improve the characteristics. Although the ground electrode is ideally provided on the reverse surface of the resin layer 10, in practice, this is difficult to achieve. This is because another wiring or holes for measurement after mounting (holes for inserting probes) may be formed on the side of the printed wiring board so as to achieve high-density mounting. Consequently, the ground electrode 17 is provided on the reverse surface of the ceramic multilayer substrate 1, that is, at the interface with the resin layer 10.

The ground electrode 17 is not made of copper foil, but is preferably made of a thick film electrode formed by firing. The reason is that the copper foil has a surface roughness $R_{max}$ of several micrometers, whereas the thick film electrode has a surface roughness $R_{max}$ of several tens of micrometers, which is larger than that of copper foil by one order. This roughness improves the bonding to the resin layer 10 with an anchoring function, thereby improving the bonding strength.

Even when the ground electrode 17 is not required, a dummy electrode (that is not connected to an electrode inside of the substrate) for improving the bonding strength can be formed on the reverse surface of the ceramic multilayer substrate 1. Since glass ceramics, such as an LTCC, have a surface roughness $R_{max}$ of several micrometers, which is similar to that of copper foil, formation of such a dummy electrode made of a fired metal significantly improves the bonding strength with the resin layer 10.

EXAMPLE 1

An example of a method for producing the laminated electronic component A shown in FIG. 1 will now be described with reference to FIGS. 6 and 7.

First, a ceramic multilayer substrate 1A, which is in a master substrate state, is prepared. The ceramic multilayer substrate 1A is preferably produced as follows.

Ceramic slurry is applied on a resin film made of polyethylene terephthalate (PET) or other suitable resin and is then dried to prepare a ceramic green sheet having a thickness of about 10 μm to about 200 μm. An example of a ceramic powder in the ceramic slurry is a mixture of BaO, $SiO_2$, $Al_2O_3$, $B_2O_3$, CaO, and other suitable mixtures.

Through holes (via holes) having a diameter of about 0.1 mm are formed through the green sheet using a die, a laser, or other suitable devices. Conductive paste prepared by mixing a metal powder primarily composed of Ag or Cu, a resin, and an organic solvent is filled in the via holes and is then dried. This conductive paste forms via conductors 3.

The same conductive paste is printed on the green sheet by screen printing or other suitable method so as to provide a predetermined pattern and is then dried. This conductive paste forms inner electrodes 2.

An appropriate number of green sheets are stacked and are compression bonded under a pressure of about 100 kg/cm² to about 1,500 kg/cm² and at a temperature of about 40° C. to about 100° C.

Pad electrodes 4 and 5 for mounting devices and connecting electrodes 6 are formed on the upper and lower surfaces of the compression bonded laminate using the same conductive paste.

After the compression bonding, a groove 7a for discharging air during the bonding is formed on the surface to be bonded with a resin sheet 10A so as to have a grid shape. A breaking groove 8 is formed on the opposite surface so as to have a grid shape (see FIG. 7). These grooves 7a and 8 are disposed so as to face each other. The grooves 7a and 8 may be formed by processing with a press die during the compression bonding or by processing the surfaces of the laminate with a dicer or a laser.

Subsequently, the laminate is fired in air at about 850° C. for conductive paste including Ag or fired in nitrogen at about 950° C. for conductive paste including Cu. The laminate has a thickness of, for example, about 1 mm. After firing, as required, Ni/Sn films, Ni/Au films, or other suitable films are formed on the electrodes exposed on the upper and lower surfaces by plating or other suitable method.

Thus, the ceramic multilayer substrate 1A is produced.

Subsequently, circuit devices 16 are mounted on the pad electrodes 5 provided on the reverse surface of the ceramic multilayer substrate 1A.

Subsequently, copper foil having a thickness of about 10 μm to about 40 μm is formed on a support 22 such as a metal plate or an adhesive sheet by plating or application. The steps of applying a photo resist, exposing, developing for etching, and removing the resist are performed to form a pattern. This copper foil forms outer terminal electrodes 11.

Subsequently, a resin sheet 10A, which is in a semi-cured state and in a master substrate state, is prepared. The resin sheet 10A is preferably made of a thermosetting resin (an epoxy, a phenol, a cyanate resin, or other suitable thermosetting resin) and an inorganic filler ($Al_2O_3$, $SiO_2$, $TiO_2$, or other suitable inorganic filler) mixed therein. Via holes 13 for conduction are formed through the resin sheet 10A by, for example, a laser (see FIG. 7). The semi-cured state represents a B-stage state or a prepreg state. A conductive resin (a mixture of metal particles such as Au, Ag, Cu, Ni particles, or other suitable metal particles and a thermosetting resin such as an epoxy, a phenol, a cyanate resin, or other suitable thermosetting resin) is filled in the via holes 13. When solder is filled in the via holes 13, the solder may be filled by, for example, reflowing after the resin sheet 10A is compression bonded with the ceramic multilayer substrate 1A.

When the thickness of the ceramic multilayer substrate 1A is about 1 mm, the thickness of the resin sheet 10A is preferably about 100 μm for the resin sheet 10A that does not include circuit devices 16 therein, or the thickness of the resin sheet 10A is preferably about 400 μm for the resin sheet 10A that includes circuit devices 16 therein. Accordingly, when components are not installed, the ratio of the thicknesses, ceramic:resin, is about 10:1, and when components are installed, the ratio of the thicknesses, ceramic:resin, is about 10:4.

The support 22, the resin sheet 10A, and the ceramic multilayer substrate 1A, which are prepared as described above, are arranged and compression bonded by heating (see FIG. 6(*a*)).

The resin sheet 10A in the semi-cured state is compression bonded on the reverse surface (lower surface) of the ceramic multilayer substrate 1A by thermal compression bonding, and at the same time, fills spaces between the circuit devices 16. In this step, since the ceramic multilayer substrate 1A and the resin sheet 10A are compression bonded in the master substrate state, air may be trapped between the components.

However, the trapped air is released through the groove 7a for discharging air formed on the lower surface of the ceramic multilayer substrate 1A. Therefore, trapping of air in the interface between the resin sheet 10A and the ceramic multilayer substrate 1A is prevented. In addition, a strong compression bonding of the resin sheet 10A enables a portion of the resin sheet 10A to be filled in the groove 7a. The groove 7a need not be completely filled with the resin sheet 10A. The groove 7a may be partially filled with the resin sheet 10A.

When the compression bonding of the resin sheet is performed in a vacuum, the air is more easily removed.

The via conductors 12 provided through the resin sheet 10A are electrically connected to the connecting electrodes 6 provided on the reverse surface of the ceramic multilayer substrate 1A by the thermal compression bonding.

When the support 22 is separated from the resin sheet 10A, the copper foil applied on the support 22 is transferred to the resin sheet 10A so as to form the outer terminal electrodes 11.

Figure 6A:
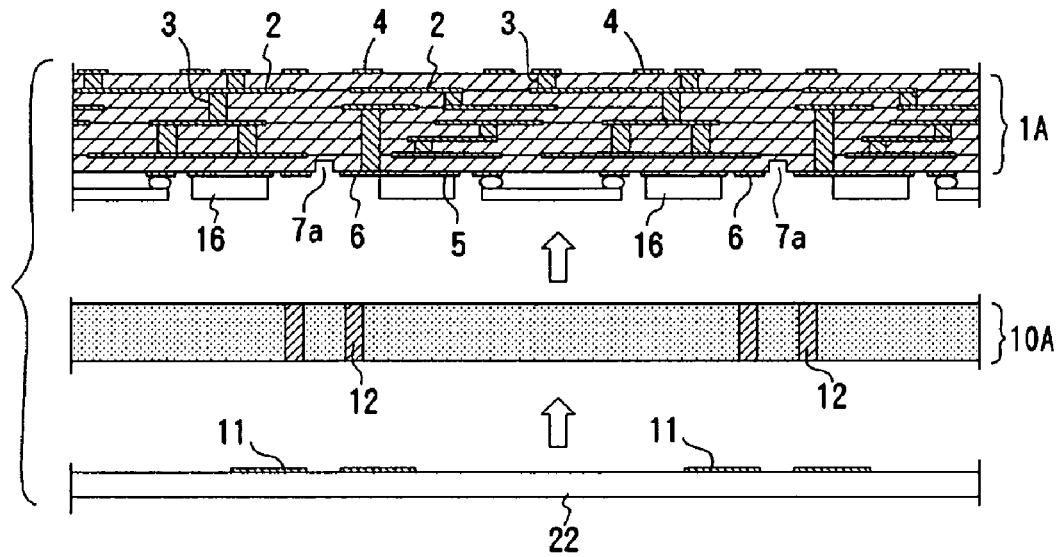
FIGS. 6A-6D include process drawings showing the steps of producing a laminated electronic component.
Figure 6B:
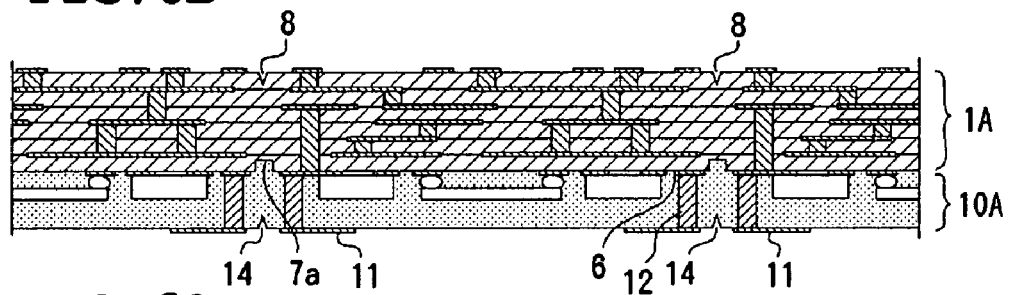

Subsequently, as shown in FIG. 6(b), a breaking groove 14 is provided on the lower surface of the resin sheet 10A of a combined laminate formed by the compression bonding. The groove 14 is formed so as to have a grid shape at a location facing the breaking groove 8 provided on the surface of the ceramic multilayer substrate 1A.

Figure 6C:
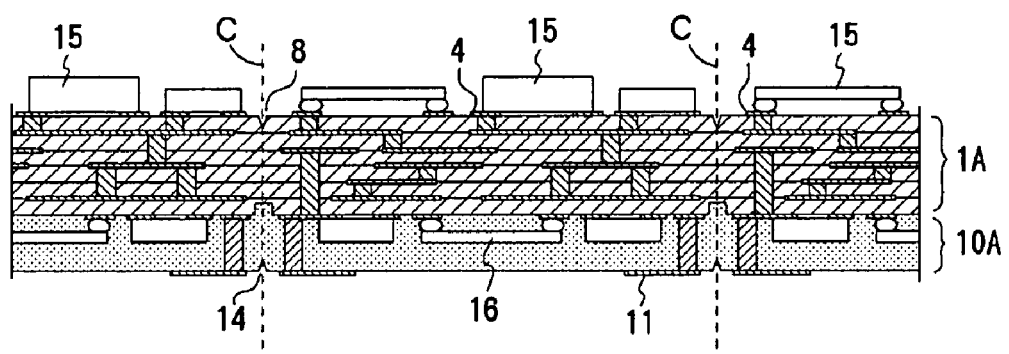

Subsequently, as shown in FIG. 6(c), circuit devices 15 are mounted on the pad electrodes 4 provided on the upper surface of the combined laminate, that is, the surface of the ceramic multilayer substrate 1A.

Figure 6D:
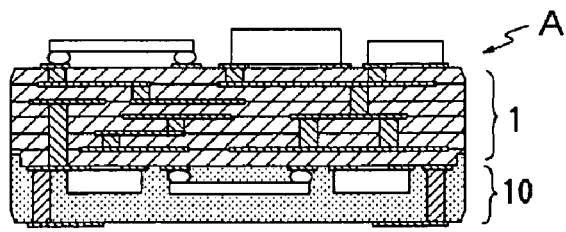

The combined laminate is then broken into separate pieces along breaking lines shown by broken lines C to form a laminated electronic component A as shown in FIG. 6(d). The breaking grooves 8 and 14 are formed at opposed locations on the upper and lower surfaces of the combined laminate and the groove 7a is also formed at locations corresponding to the breaking grooves 8 and 14. Therefore, the combined laminate is easily broken in the breaking process. The groove 7a becomes a recess 7 when the combined laminate is broken into separate pieces.

When cutting is performed with a dicer, instead of breaking, the breaking grooves 8 and 14 disposed on the upper and lower surfaces of the combined laminate are not required. In this case, the combined laminate is cut along the groove 7a for discharging air. Also in this case, the recess 7 remains on the lower edge of the ceramic multilayer substrate.

The divided electronic component A may be covered with a case 21 to form a laminated electronic component with a case as shown in FIG. 4. Also, in the step of FIG. 6(c), the surface of the ceramic multilayer substrate 1A may be molded with a resin 20, and the resultant combined laminate may then be cut by breaking or dicing to form a laminated electronic component as shown in FIG. 3.

EXAMPLE 2

Figure 7:
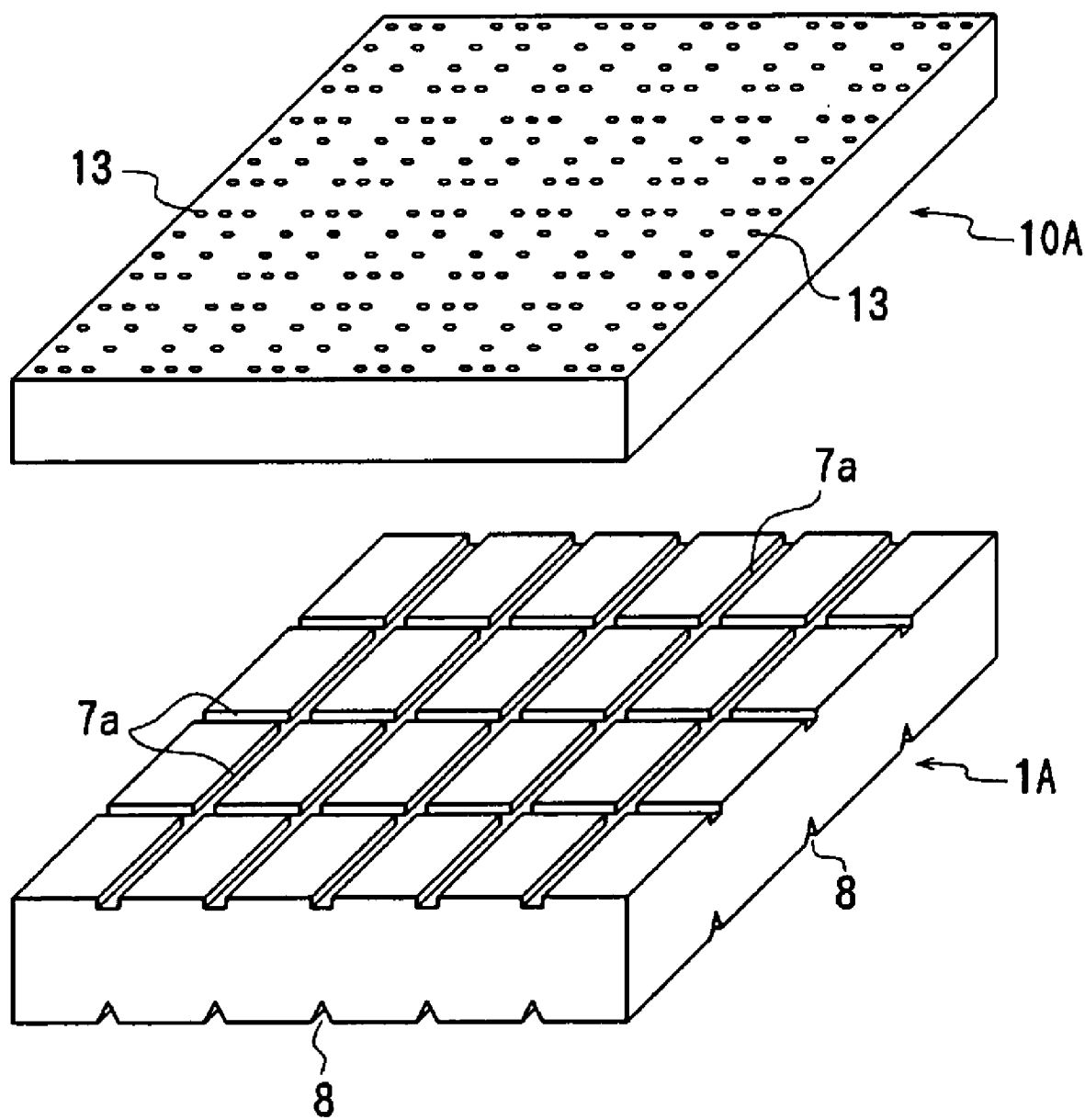
FIG. 7 includes perspective views of a ceramic multilayer substrate and a resin sheet used in the production steps shown in FIG. 6.
Figure 8:
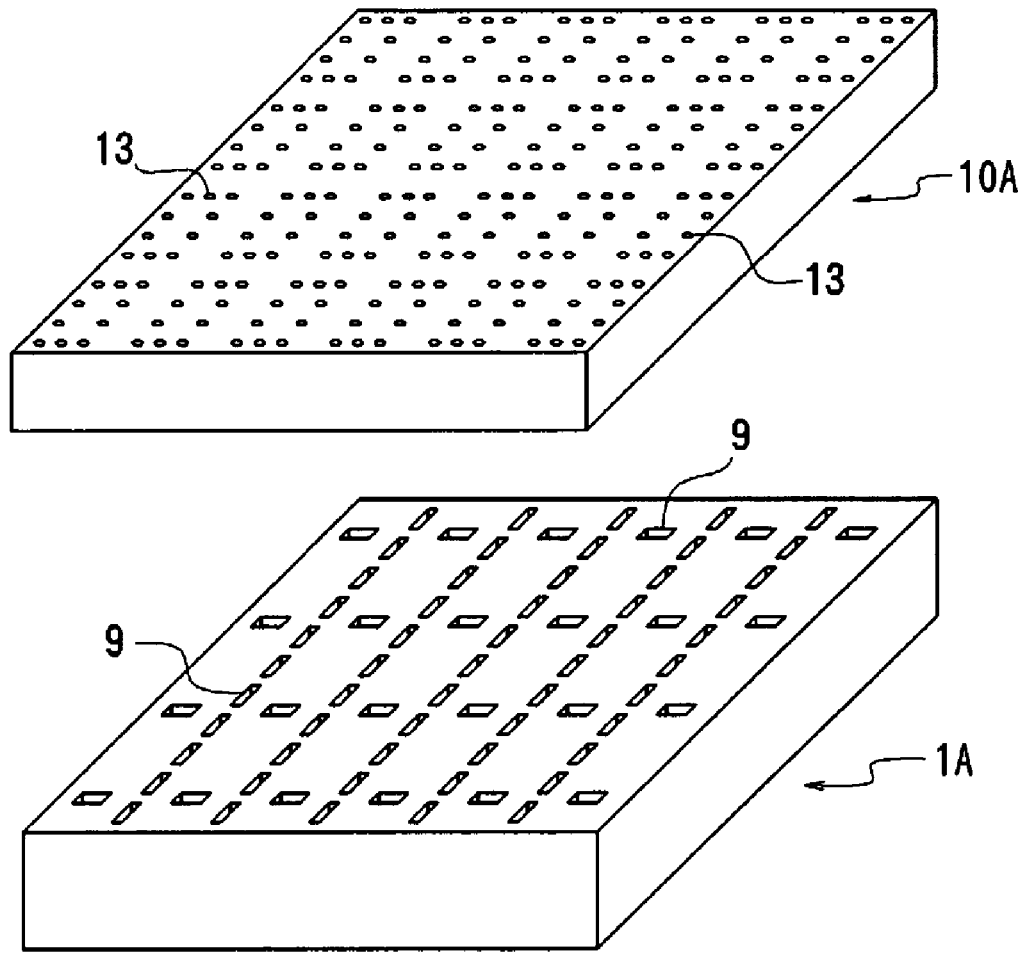
FIG. 8 includes perspective views of a ceramic multilayer substrate and a resin sheet in another example.

Although FIG. 7 shows an example including the groove 7a for discharging air that is provided on the ceramic multilayer substrate 1A, FIG. 8 shows an example including holes 9 extending in the thickness direction instead of the groove 7a.

When a ceramic multilayer substrate 1A and a resin sheet 10A in the semi-cured state are compression bonded by heating, air may be trapped in the interface. However, the trapped air can be released to the reverse surface side through the through holes 9 for discharging air that are provided thorough the ceramic multilayer substrate 1A. Therefore, trapping of air in the interface between the resin sheet 10A and the ceramic multilayer substrate 1A is prevented. In addition, a strong compression bonding of the resin sheet 10A enables a portion of the resin sheet 10A to be embedded in the holes 9.

Figure 9:
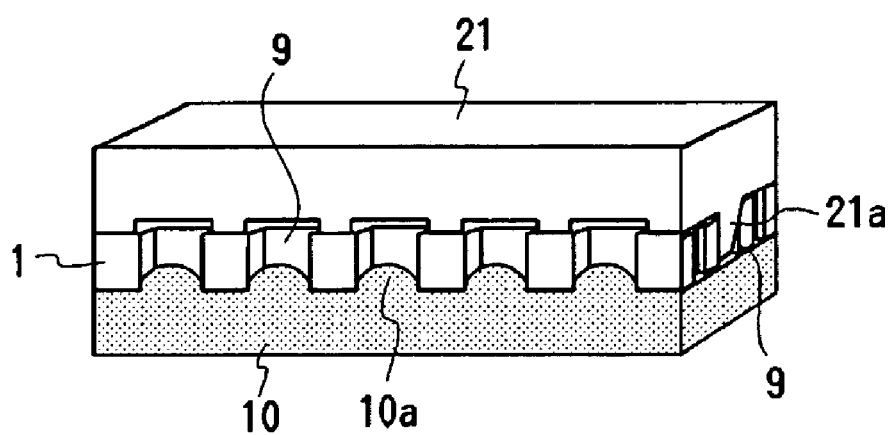
FIG. 9 is a perspective view showing a state in which a case covers a ceramic multilayer substrate and a resin sheet.

Also in this example, the surface of the ceramic multilayer substrate 1A may be molded with the resin 20 or covered with the case 21. When the case 21 is provided, as shown in FIG. 9, a portion 21a of the case 21 may be inserted in the through holes (groove portions) 9 formed after dividing of the ceramic multilayer substrate 1A. Thus, the case 21 can be accurately positioned.

In the above examples, the groove 7a and the through holes 9 for discharging air are formed so as to have a grid shape on the ceramic multilayer substrate 1A that is in a master substrate state. Alternatively, the groove 7a and the through holes 9 may be formed so as to have any suitable shape according to the dimension of sub-substrates (separate pieces).

In the example shown in FIG. 8, only the through holes 9 are formed through the ceramic multilayer substrate 1A. However, a groove for breaking may be formed at a location corresponding to the through holes 9.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

The invention claimed is:

1. A laminated electronic component comprising:
   a combined laminate including:
      a ceramic substrate having a first principal surface, a second principal surface, side surfaces, and a recess continuously extending on a peripheral portion of the first principal surface; and
      a resin layer that is compression bonded and heat-cured to the first principal surface of the ceramic substrate; wherein
      a portion of a peripheral portion of the resin layer is embedded in the recess;
      an outer terminal electrode is provided on an outer surface of the resin layer; and
      the recess extends from at least one of the side surfaces into the first principal surface so as to define a stair shape.

2. The laminated electronic component according to claim 1, wherein the ceramic substrate is a ceramic multilayer substrate including a plurality of laminated ceramic layers.

3. The laminated electronic component according to claim 1, further comprising:
   a first internal circuit element provided inside of the ceramic substrate; and
   a second internal circuit element provided inside of the resin layer and electrically connected to the first internal circuit element; wherein
   the outer terminal electrode is electrically connected to the second internal circuit element.

4. The laminated electronic component according to claim 3, further comprising:
   a first pad electrode provided on the second principal surface of the ceramic substrate and electrically connected to the first internal circuit element; and
   a first circuit device mounted on the first pad electrode.

5. The laminated electronic component according to claim 4, wherein a mold resin layer is provided on the second principal surface of the ceramic substrate so as to embed the first circuit device.

6. The laminated electronic component according to claim 4, wherein a case is provided on the second principal surface of the ceramic substrate so as to cover the first circuit device.

7. The laminated electronic component according to claim 3, further comprising:
- a second pad electrode provided in an interface between the ceramic substrate and the resin layer and electrically connected to the first internal circuit element or to the second internal circuit element; and
- a second circuit device mounted on the second pad electrode and fixed so as to be embedded in the resin layer.

8. A laminated electronic component comprising:
a combined laminate including:
- a ceramic substrate having a first principal surface, a second principal surface, side surfaces, and a plurality of groove portions provided on the side surfaces and extending in a thickness direction of the ceramic substrate; and
- a resin layer that is compression bonded and heat-cured to the first principal surface of the ceramic substrate; wherein
a portion of a peripheral portion of the resin layer is embedded in the groove portions;
an outer terminal electrode is provided on the outer surface of the resin layer; and
the groove portions extend from at least one of the side surfaces into the first principal surface so as to define a stair shape.

9. The laminated electronic component according to claim 8, wherein the ceramic substrate is a ceramic multilayer substrate including a plurality of laminated ceramic layers.

10. The laminated electronic component according to claim 8, further comprising:
- a first internal circuit element provided inside of the ceramic substrate; and
- a second internal circuit element provided inside of the resin layer and electrically connected to the first internal circuit element; wherein
the outer terminal electrode is electrically connected to the second internal circuit element.

11. The laminated electronic component according to claim 10, further comprising:
- a first pad electrode provided on the second principal surface of the ceramic substrate and electrically connected to the first internal circuit element; and
- a first circuit device mounted on the first pad electrode.

12. The laminated electronic component according to claim 11, wherein a mold resin layer is provided on the second principal surface of the ceramic substrate so as to embed the first circuit device.

13. The laminated electronic component according to claim 11, wherein a case is provided on the second principal surface of the ceramic substrate so as to cover the first circuit device.

14. The laminated electronic component according to claim 10, further comprising:
- a second pad electrode provided in an interface between the ceramic substrate and the resin layer and electrically connected to the first internal circuit element or to the second internal circuit element; and
- a second circuit device mounted on the second pad electrode and fixed so as to be embedded in the resin layer.

15. The laminated electronic component according to claim 11, wherein a case is arranged on the second principal surface of the ceramic substrate so as to cover the first circuit device, and wherein a portion of the case is embedded in the groove portions disposed on a peripheral portion of the second principal surface of the ceramic substrate.

* * * * *